(12) United States Patent
Hoshino

(10) Patent No.: US 11,553,607 B2
(45) Date of Patent: Jan. 10, 2023

(54) ELECTRONIC DEVICE

(71) Applicant: DENSO CORPORATION, Kariya (JP)

(72) Inventor: Takashi Hoshino, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/465,204

(22) Filed: Sep. 2, 2021

(65) Prior Publication Data

US 2022/0078929 A1   Mar. 10, 2022

(30) Foreign Application Priority Data

Sep. 7, 2020   (JP) .............................. JP2020-149972

(51) Int. Cl.
*H05K 1/18* (2006.01)
*H05K 5/00* (2006.01)
*H01Q 3/02* (2006.01)

(52) U.S. Cl.
CPC ............ *H05K 5/0069* (2013.01); *H05K 1/18* (2013.01); *H01Q 3/02* (2013.01); *H05K 2201/10098* (2013.01); *H05K 2201/10265* (2013.01)

(58) Field of Classification Search
CPC .................. H05K 5/0069; H05K 1/18; H05K 2201/10098; H05K 2201/10265; H01Q 3/02

USPC .......................................................... 174/260
See application file for complete search history.

(56) References Cited

U.S. PATENT DOCUMENTS

| 2015/0116955 A1* | 4/2015 | Tsuji | ..................... H05K 7/1429 239/289 |
| 2015/0250072 A1* | 9/2015 | Ichikawa | ........... H01R 13/6658 439/587 |

FOREIGN PATENT DOCUMENTS

| JP | 3748810 B2 | 2/2006 |
| JP | 2011-234197 A | 11/2011 |
| JP | 2018-101872 A | 6/2018 |

* cited by examiner

*Primary Examiner* — Andargie M Aychillhum
(74) *Attorney, Agent, or Firm* — Posz Law Group, PLC

(57) ABSTRACT

An electronic device includes: a circuit board having a wiring board on which wiring is formed, and an electronic component that is electrically and mechanically connected to the wiring via a first solder. A base is provided to accommodate the circuit board, and has a side wall that faces a side surface of the wiring board. A leaf spring arranged on the circuit board, and is configured to be contactable with the base. The leaf spring includes a fixing portion arranged on the circuit board and a pressing portion extending from and connected to the fixing portion and pressing the side wall, and the pressing portion in a biased state toward a housing establishes a contact thereto when the circuit board is put in and accommodated by the base.

11 Claims, 12 Drawing Sheets

ELECTRONIC DEVICE

CROSS REFERENCE TO RELATED APPLICATION

The present application is based on and claims the benefit of priority of Japanese Patent Application No. 2020-149972, filed on Sep. 7, 2020, the disclosure of which is incorporated herein by reference.

TECHNICAL FIELD

The present disclosure generally relates to electronic devices.

BACKGROUND INFORMATION

An antenna device, which is an example of an electronic device, includes a circuit board and a housing electrically connected to each other. The antenna device includes a circuit board, a housing that changes the radiation direction of radio waves of an antenna element of the circuit board, and a conductive gasket that electrically connects the circuit board and the housing. Electronic components such as antenna elements and microcontrollers are mounted on the circuit board.

SUMMARY

It is an object of the present disclosure to provide an electronic device capable of improving the life of the connecting member.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
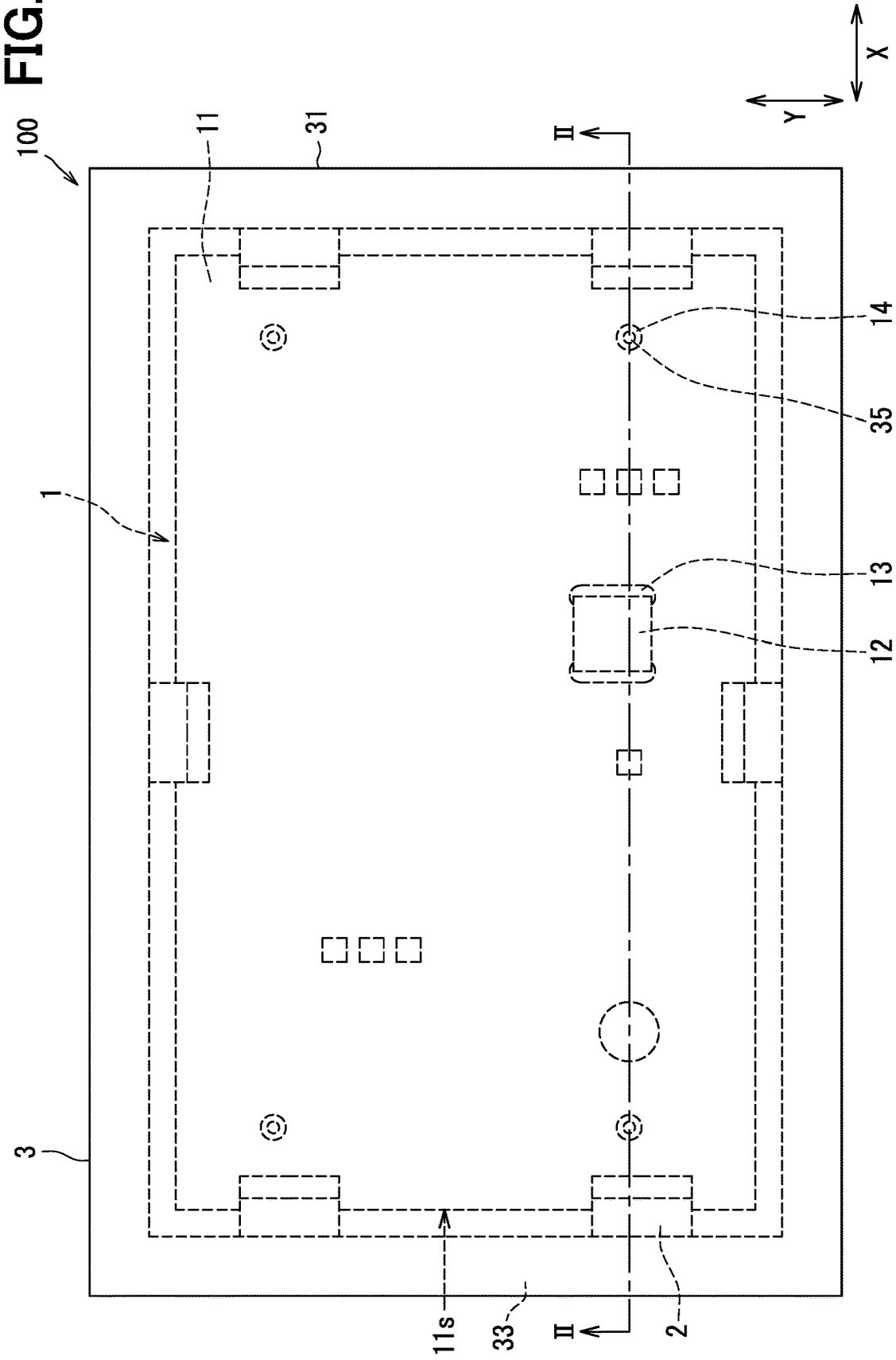
FIG. 1 is a perspective view of a schematic configuration of an electronic device according to an embodiment.

In the following, multiple embodiments for implementing the present disclosure are described with reference to the drawings. In each embodiment, portions corresponding to those described in the preceding embodiment are denoted by the same reference numerals, and redundant descriptions are omitted in some cases. In each embodiment, in a case where only a portion of the configuration is described, the other portion of the configuration may be applied with reference to the other embodiment described above.

In the following, the three directions orthogonal to each other are referred to as the X direction, the Y direction, and the Z direction. In addition, a plane defined by the X direction and the Y direction is denoted as an XY plane, a plane defined by the X direction and the Z direction is denoted as an XZ plane, and a plane defined by the Y direction and the Z direction is denoted as a YZ plane.

Embodiment

An electronic device 100 of the present embodiment is described with reference to FIGS. 1, 2, 3, and 4.

The electronic device 100 includes a circuit board 1, a leaf spring 2, and a housing 3 as its components. The circuit board 1 is housed in the housing 3 together with the leaf spring 2. In the following, the state in which the circuit board 1 is housed or accommodated in the housing 3 may also be simply referred to as an accommodated state. Further, as is described later, the circuit board 1 is housed or accommodated in a base 31 of the housing 3. Therefore, in the present embodiment, it can be understood that a state in which the circuit board 1 is housed in the base 31 may also be an accommodated state.

The circuit board 1 has a wiring board 11 and an electronic component 12. The wiring board 11 has a conductive wiring 15 and a support hole 14 formed on an insulating board such as resin, ceramics or the like. The wiring board 11 has one surface, an opposite surface opposite to the one surface, and an annular board side surface 11s connected to both of the one surface and the opposite surface. The wiring board 11 has, for example, a rectangular parallelepiped shape. Therefore, the wiring board 11 has four board side surfaces 11s.

Note that the one surface and the opposite surface are respectively a surface extending along the XY plane. On the other hand, the board side surface 11s is a surface along the Z direction. That is, the board side surface 11s is a surface along the XZ plane or the YZ plane.

The wiring 15 is provided on the surface or inside of the board. The wiring 15 also includes a land on which the electronic component 12 is mounted. Further, the wiring 15 includes a plurality of portions having different potentials.

Figure 3:
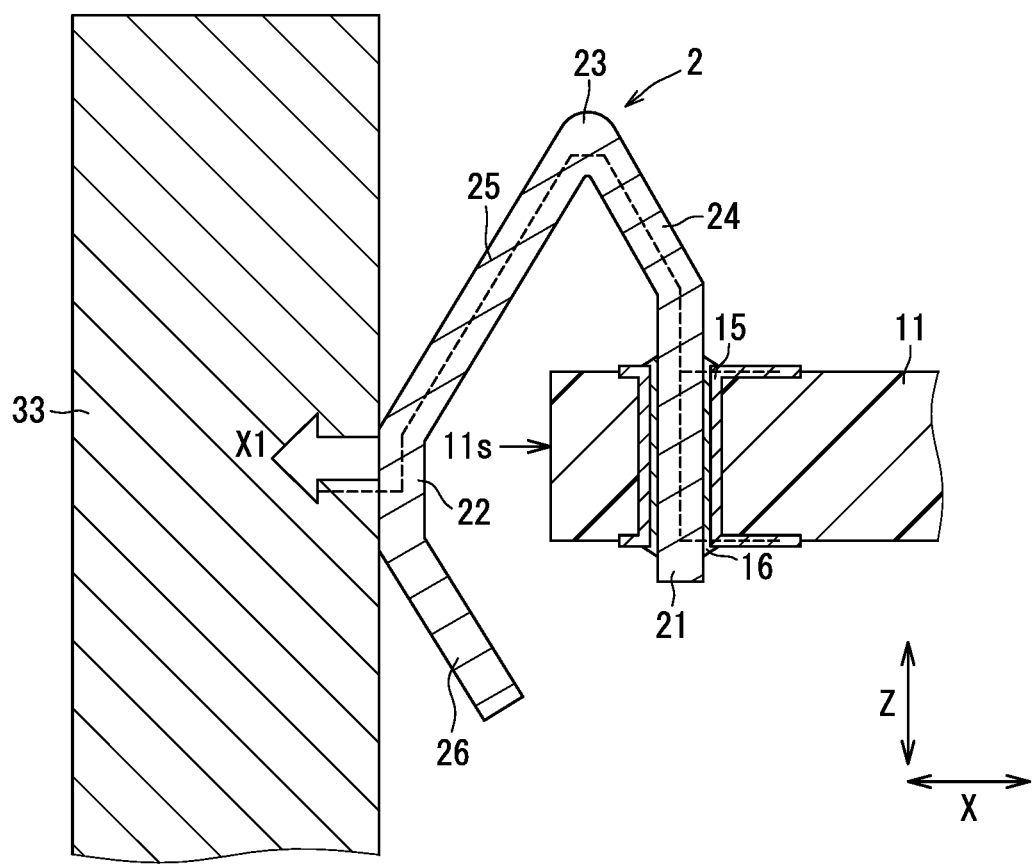
FIG. 3 is an enlarged cross-sectional view of a portion III of FIG. 2.

As shown in FIG. 3, a portion of the wiring 15 is provided to extend from a surface of a through hole provided in the board to the one surface and to the opposite surface. Further, it can be understood that the wiring board 11 is provided with through holes. In the following, the wiring 15 provided to extend from the surface of the through hole to the one surface and to the opposite surface may also be referred to as a through-hole wiring 15.

Note that the through hole is a hole provided to extend from the one surface to the opposite surface. That is, it can be understood that the through hole is a hole along the Z direction or a hole provided along a thickness direction of the wiring board 11.

The through-hole wiring 15 is provided at a plurality of positions such as the four corners of the board. In FIG. 1, the through-hole wiring 15 is provided at an overlapping position where the wiring board 11 and the leaf spring 2 overlap. Therefore, in the present embodiment, a configuration in which the through-hole wiring 15 is provided at six positions is adopted as an example. The through-hole wiring 15 is, for example, a portion of a ground potential wiring on the wiring board 11. The through-hole wiring 15 is electrically and mechanically connected to the leaf spring 2 by a second solder 16. Such configuration is described in detail later.

The electronic component 12 is a circuit element that constitutes a circuit together with the wiring 15. The electronic component 12 is, for example, a resistance element, a capacitor, a switching element, a microcontroller, a connector, or the like. However, the electronic component 12 is not limited to the above. Further, the electronic component 12 can either be a surface mount type element or an insertion mount type element.

Figure 2:
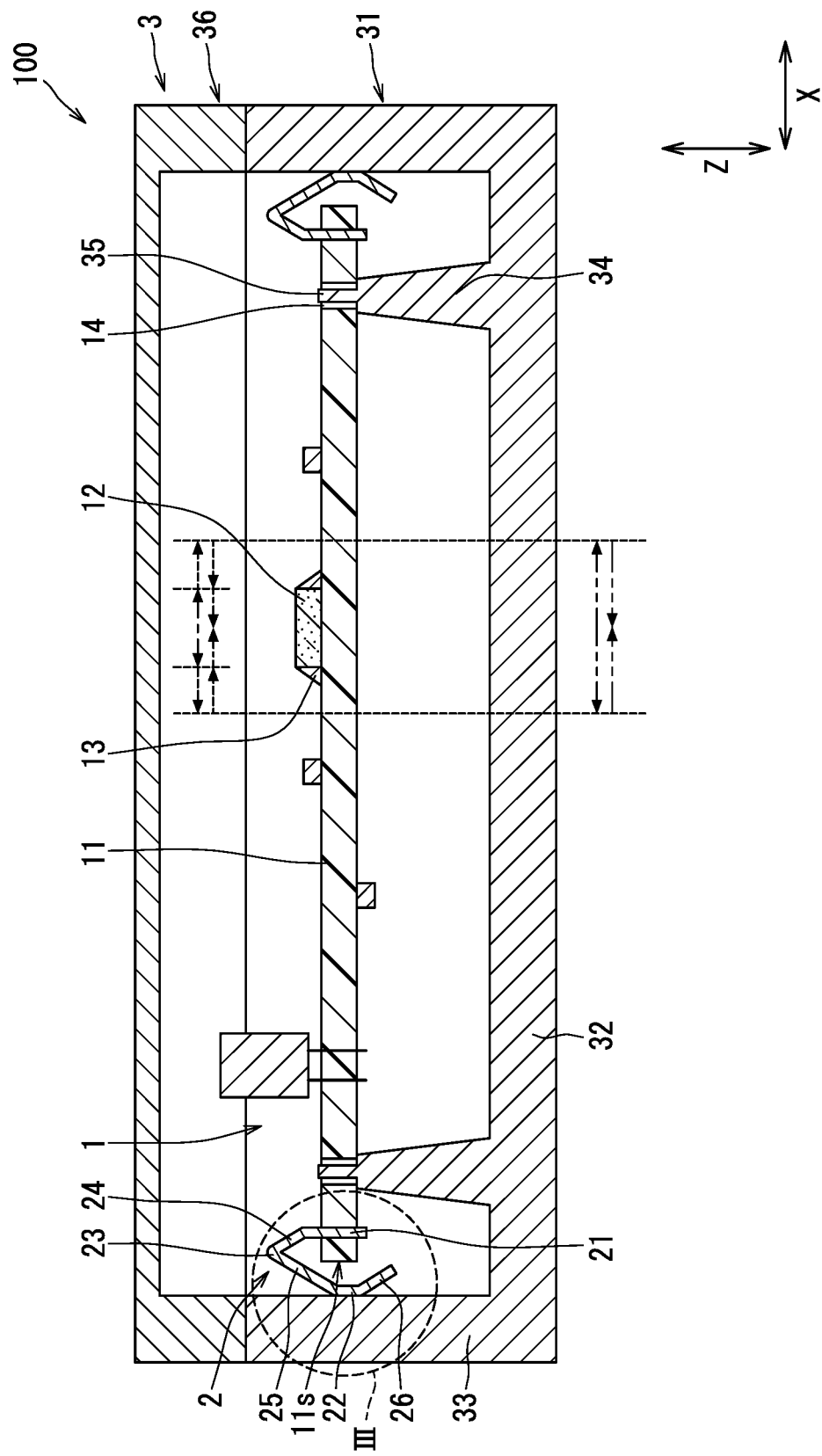
FIG. 2 is a cross-sectional view taken along a line II-II of FIG. 1.

As shown in FIGS. 1 and 2, the electronic component 12 is mounted on the wiring board 11 by using a first solder 13. More specifically, an electrode (i.e., a terminal) of the electronic component 12 and a portion of the wiring 15 are electrically and mechanically connected by the first solder 13. The first solder 13 corresponds to a conductive connecting member.

The first solder 13 and a second solder 16 (FIGS. 3, 4) are often made of the same material. In the present embodiment, the names (i.e., first and second solders) are changed because the positions where they are provided are different. Further, the connecting member is not limited to solder. As the connecting member, for example, silver paste or the like can also be adopted.

The support hole 14 is provided, i.e., bored, from the one surface to the opposite surface. The support hole 14 is provided to support the circuit board 1 by or on the base 31. In a state where the circuit board 1 is arranged on the base 31, a protrusion 35 of a support portion 34 provided on the base 31 is inserted into the support hole 14. The circuit board 1 is supported by the support portion 34 with the protrusion 35 inserted into the support hole 14.

Note that the size of the support hole 14 is defined so as not to hinder the movement or deformation of the circuit board 1 in the XY plane. That is, the support hole 14 has a size such that a gap is formed/reserved between the support hole 14 and the protrusion 35 when the protrusion 35 is inserted therein. It can also be said that the support hole 14 has an opening area along the XY plane wider than a cross-sectional area of the protrusion 35 along the XY plane.

The leaf spring 2 is a conductive member that bends (i.e., springingly deforms) when the circuit board 1 is in a housed state in the base 31. For example, the leaf spring 2 is composed mainly of metal. However, the leaf spring 2 may also be composed mainly of a material different from metal. Further, the leaf spring 2 is arranged on the circuit board 1 and is configured to be contactable with the base 31.

As shown in FIGS. 2 and 3, the leaf spring 2 has a fixing portion 21, a pressing portion 22, a bent portion 23, a first intermediate portion 24, a second intermediate portion 25, a guide portion 26, and the like. The leaf spring 2 may be provided as a one-body component.

The fixing portion 21 is a portion being fixed onto the circuit board 1. In other words, the fixing portion 21 is a portion arranged or disposed on the circuit board 1. The fixing portion 21 is inserted into a through hole of wiring 15. The fixing portion 21 is electrically and mechanically connected to the through-hole wiring 15 by the second solder 16 in a state of being inserted into the through hole. Therefore, it can also be said that the leaf spring 2 is electrically and mechanically connected to the wiring board 11 and the circuit board 1. As described above, in the present embodiment, as an example, a configuration in which the fixing portion 21 is arranged on the wiring board 11 of the circuit board 1 is adopted. However, the present disclosure is not limited to such configuration, and even a fixing portion 21 arranged at a position different from the wiring board 11 of the circuit board 1 can be adopted.

The fixing portion 21 is provided linearly along the thickness direction of the wiring board 11, for example. The thickness direction coincides with the Z direction, which is substantially perpendicular to the wiring board 11. Further, the leaf spring 2 has at least one fixing portion 21.

The pressing portion 22 is a portion connected to the fixing portion 21 and presses the base 31 in the accommodated state (i.e., when the circuit board 1 is accommodated in the housing 3). The pressing portion 22 is a portion that presses the side wall 33 in an X1 direction in a state of being in contact with the side wall 33 in the accommodated state. Note that the X1 direction can also be said to be a pressing direction. Further, the pressing direction can be designated as a longitudinal direction of the leaf spring 2. Further, the leaf spring 2 has at least one pressing portion 22.

In the present embodiment, as an example, a leaf spring 2 in which the fixing portion 21 and the pressing portion 22 face each other is adopted. The pressing portion 22 is provided, i.e., extends, linearly along the thickness direction of the wiring board 11, for example, in the accommodated state. That is, the pressing portion 22 is provided in parallel with the side wall 33 (and with the fixing portion 21) in the accommodated state.

The bent portion 23 is a portion that is bent at a position between the fixing portion 21 and the pressing portion 22. In the leaf spring 2, the fixing portion 21 and the pressing portion 22 are arranged to face each other by forming the bent portion 23. The leaf spring 2 deforms as the bent portion 23 springingly deforms, in a direction in which a distance between the fixing portion 21 and the pressing portion 22 becomes shorter by such deformation.

The first intermediate portion 24 is a portion between the fixing portion 21 and the bent portion 23. Thus, the fixing portion 21 and the bent portion 23 are connected via the first intermediate portion 24.

The second intermediate portion 25 is a portion between the pressing portion 22 and the bent portion 23. Thus, the pressing portion 22 and the bent portion 23 are connected via the second intermediate portion 25.

The guide portion 26 is a portion that facilitates the arrangement of the circuit board 1 that has the leaf spring 2 fixed thereon onto the base 31. The guide portion 26 is provided/positioned at a tip (i.e., on one end) of the fixing portion 21. One end of the guide portion 26 is connected to the fixing portion 21, and the other end of the guide portion 26 serves as a tip of the leaf spring 2.

The guide portion 26 is a portion provided at an angle with respect to the pressing portion 22. That is, the guide portion 26 is inclined from the pressing portion 22 toward the fixing portion 21. Further, it can be understood that the distance between the guide portion 26 and the side wall 33 becomes wider as the guide portion 26 in the accommodated state extends from the fixing portion 21 toward an end portion which is the tip of the leaf spring 2.

The leaf spring 2 is arranged at a position between the circuit board 1 and the base 31 in the accommodated state and is spring-deformed. Then, the pressing portion 22 presses the side wall 33 by a reaction force against the spring deformation. That is, it can be understood that the pressing portion 22 presses the side wall 33 with a restoring force when the spring is deformed.

Note that, when the leaf spring 2 deforms as a spring, the horizontal distance between the fixing portion 21 and the pressing portion 22 becomes shorter. That is, when the leaf spring 2 deforms springingly, such a deformation reduces the distance between the fixing portion 21 and the pressing portion 22. Further, the leaf spring 2 comes into and stays in contact with the leaf spring 2 by the displacement of the pressing portion 22 toward the base 31 when the circuit board 1 is accommodated in the base 31.

FIG. 3 shows the leaf spring 2 in an elastically-deformed state. Therefore, the leaf spring 2 in such state has a narrower gap distance between the fixing portion 21 and the pressing portion 22 than in a non-deformed state where the leaf spring 2 is not elastically deformed. The connection structure between the circuit board 1 and the housing 3 by using the leaf spring 2 is described in detail later.

The leaf spring 2 configured in such manner electrically connects the wiring 15 and the base 31 by pressing the side wall 33 with the pressing portion 22. Note that the configuration of the leaf spring 2 is not limited to the above. The leaf spring 2 may have other configuration as long as the other configuration is the one in which the leaf spring 2 has at least one fixing portion 21 and at least one pressing portion 22, and electrical connection between the wiring 15 and the base 31 is established by the pressing portion 22 pressing the side wall 33.

The housing 3 accommodates the circuit board 1. The housing 3 is made primarily of metal such as aluminum. In the present embodiment, the housing 3 having the base 31 and a cover 36 is adopted as an example. However, the housing 3 of the present disclosure may only have the base 31. Further, in the housing 3, the base 31 may be an only component made of metal. The base 31 corresponds to a housing. However, the present disclosure is not limited to such configuration, and even a component primarily made of a material different from metal (for example, resin) can be adopted as the housing 3.

As shown in FIGS. 1 and 2, the base 31 is a member having a concave shape for accommodating the circuit board 1. The base 31 has, as main components, a bottom wall 32 which is a bottom of the concave and an annular side wall 33 protruding from the bottom wall 32. The base 31 has an opening in an area above the bottom wall 32. Therefore, a top end of the side wall 33, i.e., one of two ends opposite to the bottom wall 32 can be designated as an opening-side end. The housing 3 is so configured that the cover 36 is attached to the opening-side end of the side wall 33.

The bottom wall 32 is provided along the XY plane. The side wall 33 is provided along the Z direction. Therefore, the side wall 33 has a surface facing an accommodation space (i.e., a concave space) disposed perpendicular to the bottom wall 32. Further, the base 31 has a rectangular shape in the XY plane (i.e., in a top view). Therefore, the base 31 has four side walls 33.

The base 31 with the circuit board 1 arranged/accommodated therein (i.e., in the accommodation space) has the four side walls 33 facing the board side surfaces 11s, respectively.

Further, the space surrounded by the side walls 33 is wider/broader than that of the circuit board 1. That is, a gap is reserved between the board side surfaces 11s and the side walls 33 of the base 31 in a state where the circuit board 1 is arranged/accommodated therein. The gap is reserved in order to arrange/disposed the leaf spring 2 between the circuit board 1 and the side wall 33.

Further, as shown in FIG. 2, the base 31 has the support portion 34. The support portion 34 is a portion that supports the circuit board 1 in the Z direction. The support portion 34 protrudes from the bottom wall 32. The support portion 34 has a protrusion 35 at a tip thereof. The cross-sectional area of the support portion 34 along the XY plane is wider/broader than the cross-sectional area of the protrusion 35 along the XY plane. Further, the cross-sectional area of the support portion 34 along the XY plane is wider/broader than the opening area of the support hole 14. Therefore, the base 31 can support the circuit board 1 with the protrusion 35 inserted into the support hole 14.

In the present embodiment, the base 31 in which the support portions 34 are provided at four positions is adopted. However, the present disclosure is not limited to such configuration, and any base 31 is adoptable as long as the base 31 has the support portions 34 provided at three positions at least. Further, the present disclosure can also have the base 31 which is not provided with the support portion 34.

The cover 36 is assembled to the opening-side end of the base 31. The cover 36 is assembled to the base 31 to close the opening-side end of the base 31. Therefore, the housing 3 provides an accommodation space for the circuit board 1 as an assembly of the base 31 and the cover 36.

The electronic device 100 includes the circuit board 1 to which the leaf spring 2 is attached and the base 31 configured in such manner. Therefore, as shown in FIG. 1, in the electronic device 100, the circuit board 1 and the side wall 33 are connected to each other via the leaf spring 2 in the direction along the XY plane. In particular, in the present embodiment, the electronic device 100 in which the circuit board 1 and the side wall 33 are not in direct contact with each other in the direction along the XY plane but are in contact with each other only via the leaf spring 2 is adopted. As a result, the electronic device 100 can stably hold the circuit board 1 in the direction along the XY plane.

Further, as shown in FIG. 3, in the electronic device 100, the fixing portion 21 and the through-hole wiring 15 are electrically and mechanically connected by the second solder 16. In the electronic device 100, the pressing portion 22 presses the side wall 33, so that the pressing portion 22 and the side wall 33 are electrically and mechanically connected. In particular, in the present embodiment, the through-hole wiring 15 is adopted as an example of being a portion of the ground potential wiring on the wiring board 11.

As described above, the electronic device 100 holds the circuit board 1 with respect to the base 31 and establishes an electrical connection (such as a grounding contact) between the base 31 and the circuit board 1 advantageously by the reaction force of the leaf spring 2. That is, in the electronic device 100, the circuit board 1 and the base 31 are electrically and mechanically connected via the leaf spring 2. Therefore, in the electronic device 100, the ground potential of the circuit board 1 is electrically conducted with the base 31, to further conduct the ground potential to the housing 3 via the base 31. As a result, the electronic device 100 can stabilize the ground potential of the circuit board 1 and is electromagnetically shielded to improve noise resistance.

Here, a method of manufacturing the electronic device 100 is described.

The manufacturing method includes a mounting process and an assembly process. The mounting process is a process of mounting the electronic component 12 and the leaf spring 2 on the wiring board 11. That is, the mounting process can be designated as the manufacturing process of the circuit board 1. In the mounting process, the surface mount type electronic component 12 is mounted on the wiring board 11 by reflow soldering.

Further, in the mounting process, the leaf spring 2 is mounted on the wiring board 11 by through-hole soldering. In the mounting process, when the leaf spring 2 is mounted, the insertion mount type elements and connectors are also mounted in the same process. Through-hole soldering can also be called local flow soldering. In the manufacturing method, the circuit board 1 can be manufactured by performing the mounting process.

Figure 4:
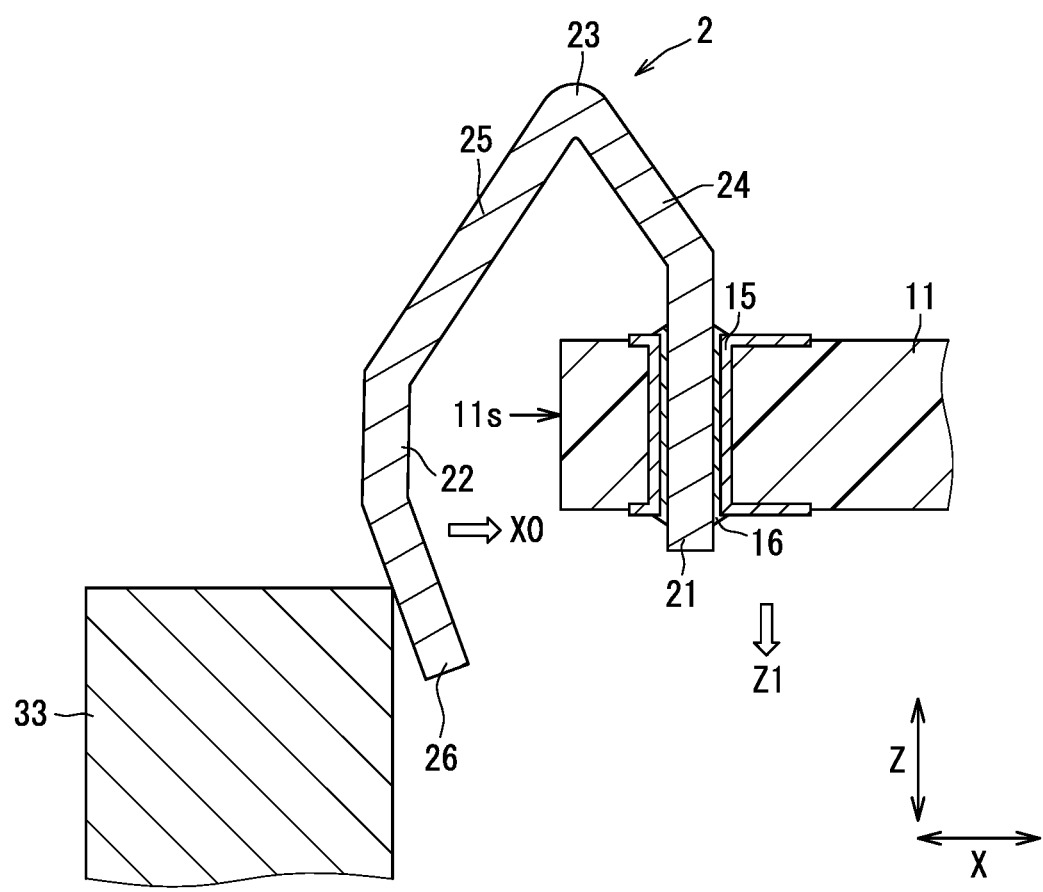
FIG. 4 is a cross-sectional view of an assembly process in the embodiment.

The assembly process is a process of assembling the circuit board 1 to the base 31. As shown in FIG. 4, in the assembly process, the circuit board 1 is moved in a Z1 direction. That is, in the assembly process, the circuit board 1 is moved from the opening side of the base 31 toward the bottom wall 32. In the assembly process, the circuit board 1 is moved so that the protrusion 35 is inserted into the support hole 14. Then, in the assembly process, the circuit board 1 is moved until the circuit board 1 comes into contact with the support portion 34. The circuit board 1 is prevented from moving further in the Z1 direction by the support portion 34. As a result, the circuit board 1 is arranged in the base 31.

Further, as shown in FIG. 4, in the assembly process, when the circuit board 1 is moved in the Z1 direction, the guide portion 26 of the leaf spring 2 comes into contact with an edge of the side wall 33. In the assembly process, the circuit board 1 is further moved in the Z1 direction from such a state. As a result, in the leaf spring 2, the pressing portion 22, the second intermediate portion 25, and the guide portion 26 are deformed in an X0 direction.

That is, the leaf spring 2 has the guide portion 26 being deformed by the pressing against the side wall 33. Further, in the assembly process, the pressing portion 22 is brought to face the side wall 33 as the circuit board 1 further moves. As shown in FIG. 3, the leaf spring 2 has the pressing portion 22 arranged to face the side wall 33 at least in a state where the circuit board 1 is in contact with the support portion 34.

Further, when the leaf spring 2 is pressed against the side wall 33 and deformed, the leaf spring 2 presses the side wall 33 with the pressing portion 22 by the restoring force. That is, as shown in FIG. 3, the leaf spring 2 presses the side wall 33 in the X1 direction.

Further, in the assembly process, the cover 36 is assembled to the base 31 to which the circuit board 1 is assembled. In such manner, the circuit board 1 is accommodated in the accommodation space formed by the base 31 and the cover 36. In such manner, the electronic device 100 is manufactured by the manufacturing method.

In the present embodiment, an example is adopted in which the circuit board 1 is moved and the circuit board 1 is arranged in the base 31. However, in the present disclosure, the circuit board 1 may be moved, or both of the circuit board 1 and the base 31 may be moved.

As described above, since the electronic device 100 includes the leaf spring 2, the leaf spring 2 can absorb the displacement difference due to the difference in the coefficients of linear expansion between the wiring board 11 and the base 31. Therefore, the electronic device 100 can reduce the stress applied to the first solder 13 due to the displacement difference, and can improve the life of the first solder 13.

More specifically, as shown in FIG. 2, the base 31 expands and contracts due to heat as shown by the arrow of a two-dot dash line. In such case, the wiring board 11 expands and contracts due to heat as shown by the arrow of a one-dot dash line. As described above, the displacement difference between the base 31 and the wiring board 11 is generated due to the difference in the coefficients of respective linear expansion.

In the meantime, when the wiring board 11 is firmly fixed to the base 31, thermal distortion occurs in the wiring board 11 due to the difference in linear expansion coefficients between the base 31 and the wiring board 11. The broken line arrow in FIG. 2 indicates the thermal distortion. However, the electronic device 100 can reduce the thermal distortion of the wiring board 11 by the leaf spring 2.

Therefore, the electronic device 100 can reduce the stress applied to the first solder 13 due to the displacement difference. Therefore, in the electronic device 100, formation of the cracks is prevented. Therefore, the electronic device 100 can improve the life of the first solder 13. In other words, the electronic device 100 can improve the life of the first solder 13 by a "bending effect" of the leaf spring 2. That is, the electronic device 100 can improve the life of the first solder 13 as compared with the configuration in which the circuit board 1 and the base 31 are firmly fixed by screws or caulking.

Further, the electronic device 100 can absorb swell or wavy deformation with the leaf spring 2 even if the side wall 33 has swell. Further, the electronic device 100 can absorb swell by the leaf spring 2 even when the circuit board 1 has a θrotation deviation. Therefore, by using the leaf spring 2, the electronic device 100 can hold the circuit board 1 with respect to the base 31 and can establish electrical connection between the base 31 and the circuit board 1. The swell is a state in which irregularities such as a concave and a convex are formed in the X direction and the Y direction. The θ rotation deviation is a deviation about a rotation axis along the Z direction.

The electronic device 100 does not constrain or bind the circuit board 1 in the Z direction. Therefore, the electronic device 100 can tolerate variations in the flatness of the wiring board 11 and variations in the height of the support portion 34. Further, the electronic device 100 does not have a fixed structure for correcting warpage, swell or waviness of the wiring board 11. Therefore, the electronic device 100 can reduce the stress on the wiring board 11 and the electronic component 12.

The preferred embodiments of the present disclosure have been described above. However, the present disclosure is not limited to the above embodiments, and various modifications are possible without departing from the spirit and scope of the present disclosure. Hereinafter, modifications 1 to 10 are described as other forms of the present disclosure. The above-described embodiments and modifications 1 to 10 can be carried out individually, but can also be carried out in combination as appropriate. The present disclosure can be performed by various combinations without being limited to the combination illustrated in the embodiment.

First Modification

Figure 5:
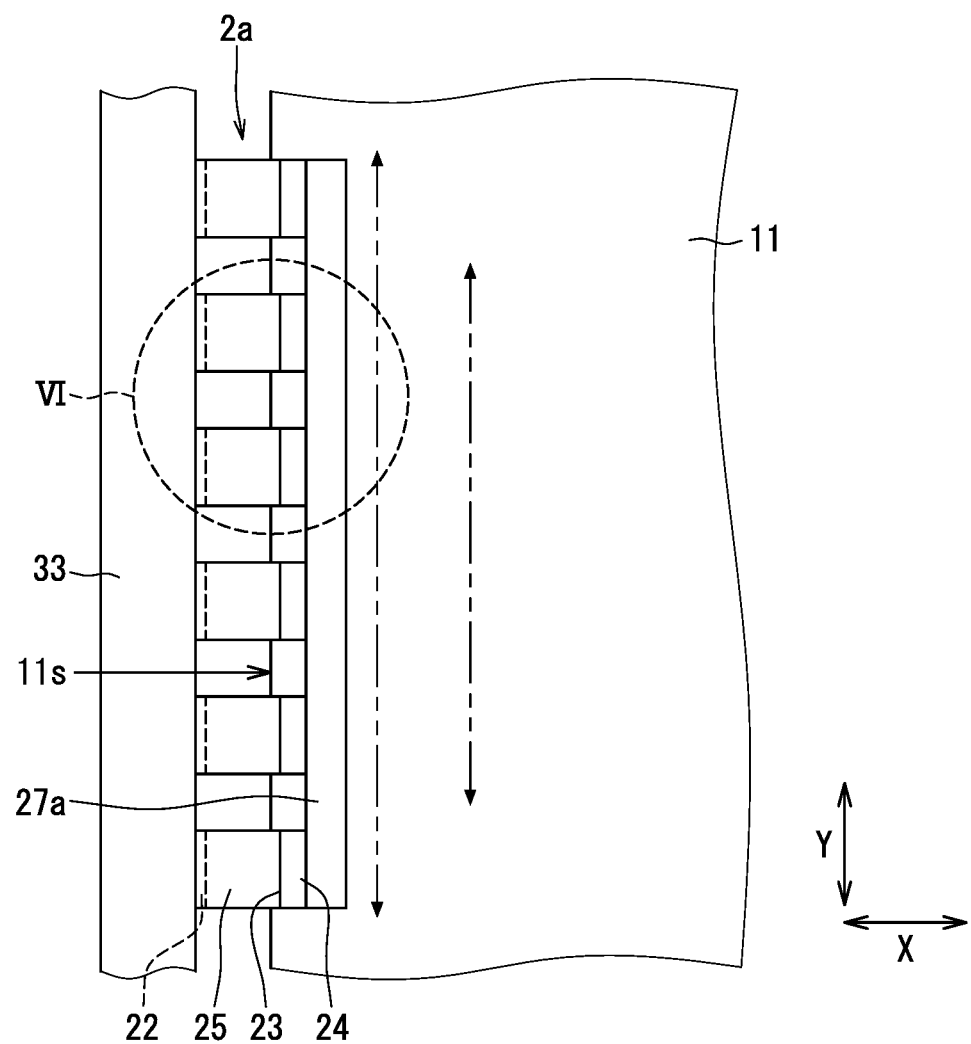
FIG. 5 is a plan view of a schematic configuration of a first modification.
Figure 6:
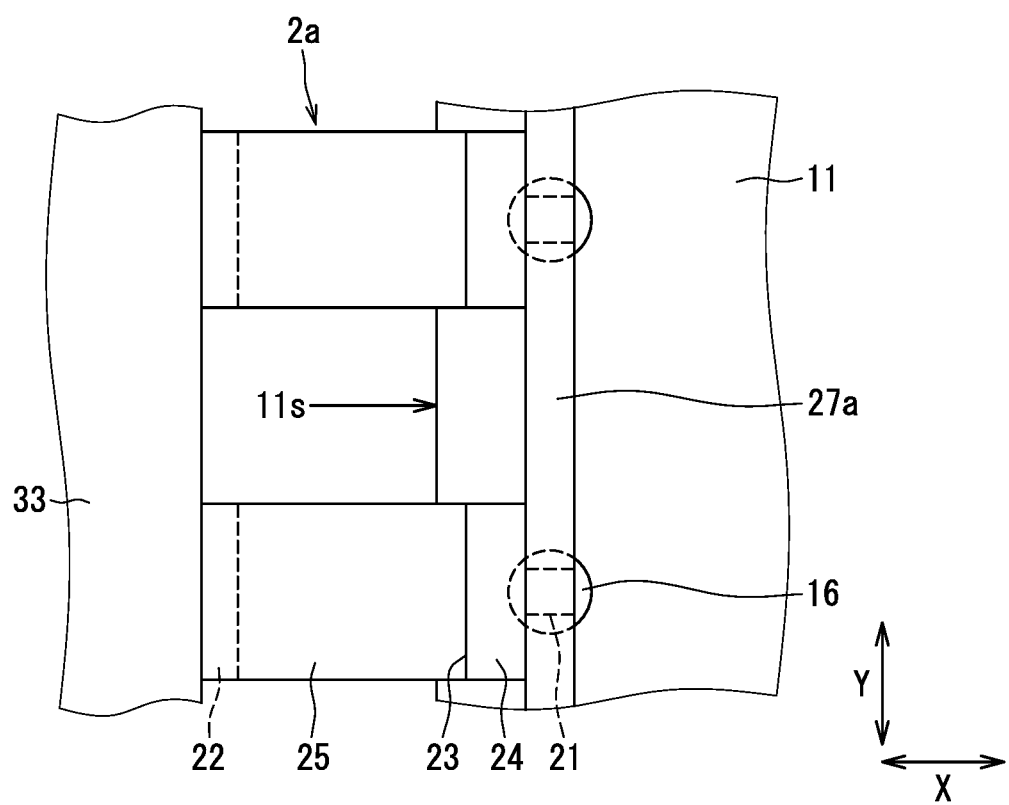
FIG. 6 is an enlarged plan view of a VI portion of FIG. 5.

The electronic device 100 is implementable as a first modification described in the following with reference to FIGS. 5 and 6. Here, a portion different from the above-described embodiment in the first modification is mainly described. In the first modification, the structure of the leaf spring 2a is different. In the first modification, the same reference numerals are given to the same configurations as those in the above embodiment.

It can be understood that the leaf spring 2a has a plurality of spring portions including a pair of fixing portions 21 and pressing portions 22. Further, the leaf spring 2a has a connecting portion 27a for connecting the spring portions. That is, the connecting portion 27a is a portion that connects the paired fixing portion 21 and the pressing portion 22. The connecting portion 27a is, for example, a flat plate-shaped portion.

The spring portion is configured in the same manner as the leaf spring 2 of the above embodiment. Therefore, the spring portion includes a bent portion 23, a first intermediate portion 24, a second intermediate portion 25, and a guide portion 26 in addition to the fixing portion 21 and the pressing portion 22. Further, the spring portion is configured as an integral, one-body component with the connecting portion 27a. The leaf spring 2a may also be understood as having a slit in between two adjacent spring portions, since a plurality of spring portions are integrated to make a one-body component by the connecting portion 27a.

In the present embodiment, as an example, a leaf spring 2a having a structure in which six spring portions are connected by a connecting portion 27a is adopted. However, the present disclosure is not limited to such configuration, and any configuration can be adopted as long as two or more spring portions are connected by the connecting portion 27a.

The first modification can achieve the same effects as that of the above embodiment. Further, in the first modification, the leaf spring 2a easily absorbs the variation in the clearance between the board side surface 11s and the side wall 33. Further, in the first modification, the structure makes it easy to suppress the conductivity failure due to the shape deviation/irregularity between the circuit board 1 and the base 31.

(Second Modification)

Figure 7:
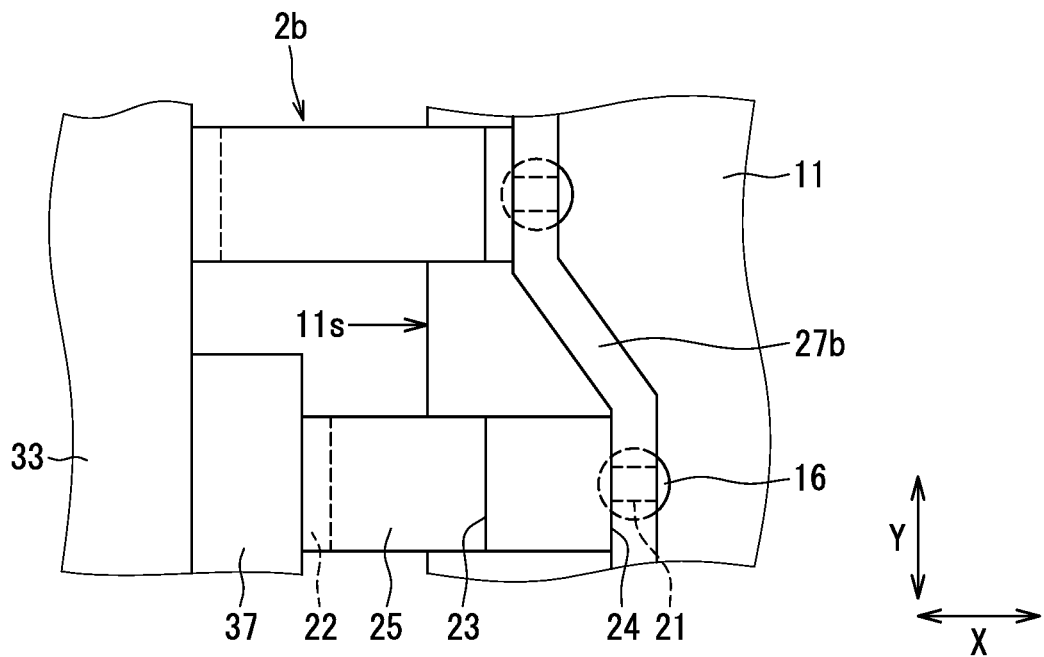
FIG. 7 is a plan view of a schematic configuration of a second modification.

The electronic device 100 is implementable as a second modification described in the following with reference to FIG. 7. Here, a portion different from the first modification in the second modification is mainly described. In the second modification, the configuration of a leaf spring 2b and the configuration of the side wall 33 are different. In the second modification, the same reference numerals as those in the first modification are given to the same configuration as the first modification.

The side wall 33 has an adjusting protrusion 37 protruding toward the side surface 11s of the board on one of the portions pressed by the pressing portion 22 in the adjacent spring portions. The side wall 33 is provided with an adjusting protrusion 37 so that the lengths of adjacent spring portions are the same. The adjusting protrusion 37 is a portion that protrudes from the periphery. Therefore, in the electronic device 100, the distance between the adjusting protrusion 37 and the board side surface 11s is narrowed while the circuit board 1 is housed in the base 31. That is, the distance between the side wall 33 and the board side surface 11s is narrower at positions where the adjusting protrusion 37 is provided than at the positions where the adjusting protrusion 37 is not provided.

The leaf springs 2b have the same length of adjacent spring portions. The length here is a length along the pressing direction in which the pressing portion 22 presses the side wall 33. Further, the length corresponds to the distance between the fixing portion 21 and the pressing portion 22.

A connecting portion 27b is inclined with respect to the pressing direction to connect adjacent spring portions. That is, the connecting portion 27b is provided so as to be inclined in the XY plane. Further, it can be understood that the connecting portion 27b is provided at an angle between the connecting portion 27b and the adjacent spring portion. Therefore, the connecting portion 27b is formed longer than the connecting portion 27a.

Since the connecting portion 27b is configured in such manner, the rigidity in the pressing direction is lower than that of the connecting portion 27a. Therefore, the leaf spring 2b is more easily deformed in the pressing direction than the leaf spring 2a.

The second modification can have the same effects as the first modification. Further, in the second modification, since the spring 2b is more easily deformable in the pressing direction, the thermal distortion on the second solder 16 can be more effectively suppressible/absorbable than in the first modification. Therefore, in the second modification, the life of the second solder 16 can be improved as compared with the first modification. Further, in the second modification, the bending effect makes it easier for the connecting portion 27b to absorb the thermal distortion due to the difference in the coefficients of linear expansion, and it can be understood that the thermal distortion on the second solder 16 is further reducible.

(Third Modification)

Figure 8:
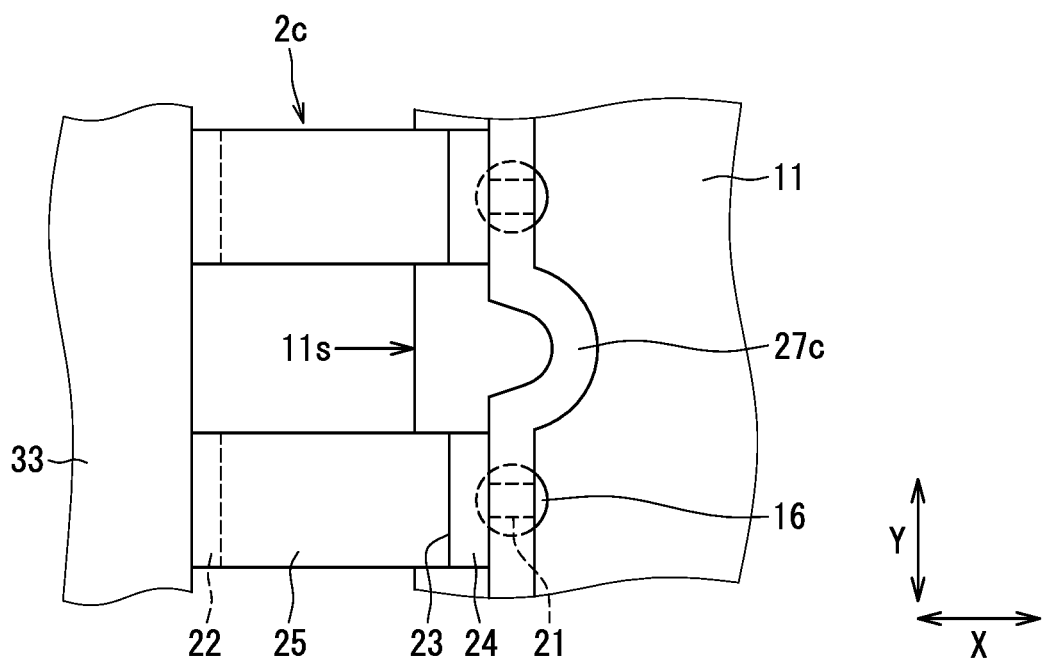
FIG. 8 is a plan view of a schematic configuration of a third modification.

The electronic device 100 may be implementable as a third modification described in the following with reference to FIG. 8. Here, a portion different from the first modification in the third modification is mainly described. In the third modification, the structure of a leaf spring 2c is different. In the third modification, the same reference numerals as those in the first modification are given to the same configuration as the first modification.

The leaf spring 2c has a curved connecting portion 27c. The connecting portion 27c has a curved shape between adjacent spring portions so that the distance between the side walls 33 and the curved shape portion becomes wider as the distance from both spring portions increases. That is, the connecting portion 27c has a curved shape in the XY plane. Therefore, the connecting portion 27c is formed longer than the connecting portion 27a.

The third modification can exert the same effects as the second modification.

(Fourth Modification)

Figure 9:
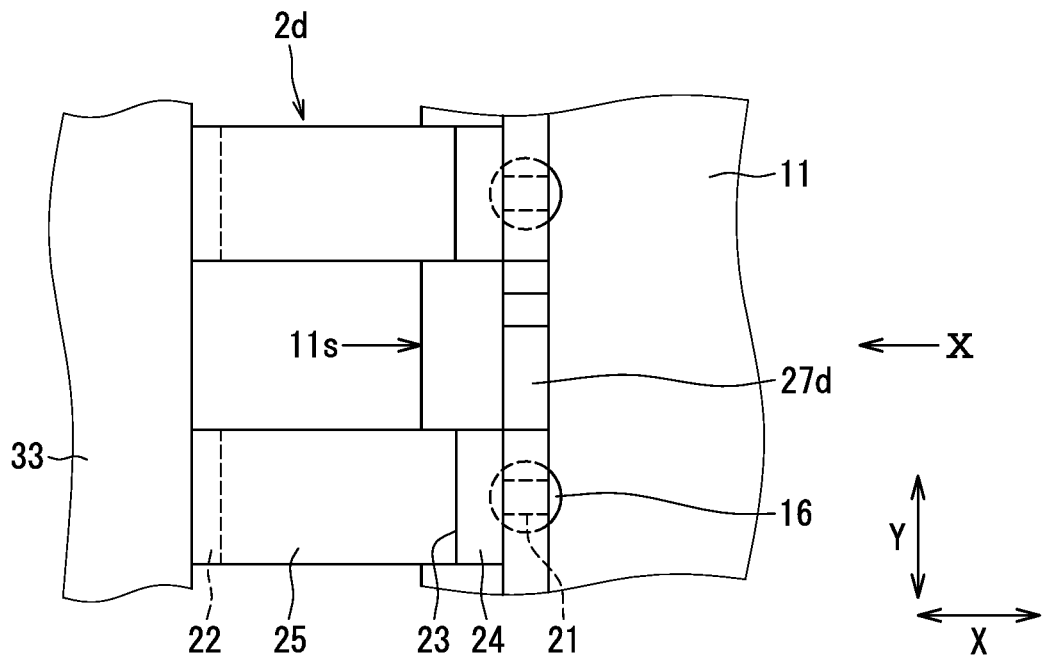
FIG. 9 is a plan view of a schematic configuration of a fourth modification.
Figure 10:
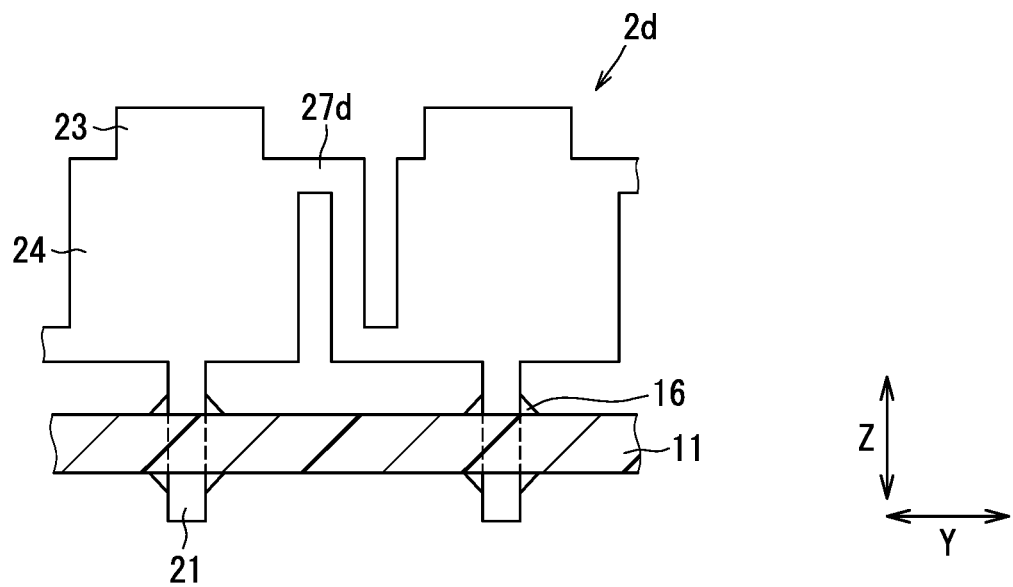
FIG. 10 is a diagram seen from a direction of an X arrow in FIG. 9.

The electronic device 100 is implementable as a fourth modification described in the following with reference to FIGS. 9 and 10. Here, a portion different from the first modification in the fourth modification is mainly described. In the fourth modification, the configuration of a leaf spring 2d is different. In the fourth modification, the same reference numerals as those in the first modification are given to the same configuration as the first modification.

The leaf spring 2d has a connecting portion 27d. As shown in FIG. 10, the leaf spring 2d has a different connection shape of the connecting portion 27d with respect to the adjacent spring portions in the Z direction. In such manner, the leaf spring 2d increases the length of the connecting portion 27d. Further, in the leaf spring 2d, the distance between the adjacent spring portions is the same as the distance between the adjacent spring portions in the leaf spring 2. That is, in the leaf spring 2d, the length of the connecting portion 27d is made longer than that of the connecting portion 27 without widening the distance between the spring portions.

The fourth modification can exert the same effects as the second modification.

(Fifth Modification)

Figure 11:
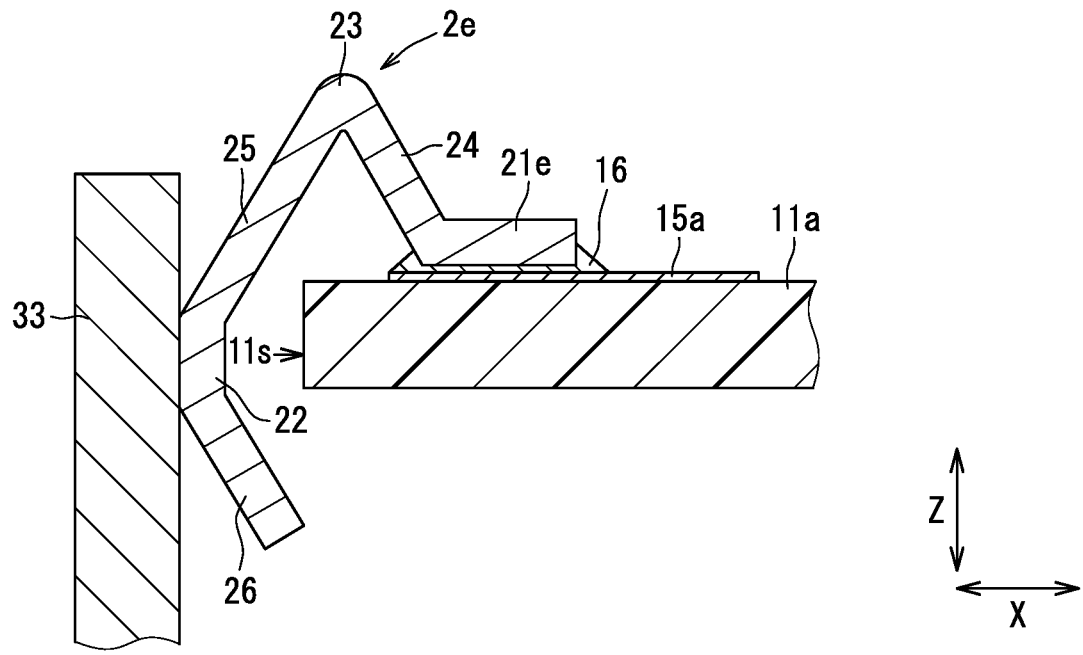
FIG. 11 is a cross-sectional view of a schematic configuration of a fifth modification.

The electronic device 100 is implementable as a fifth modification described in the following with reference to FIG. 11. Here, a portion different from the embodiment in the fifth modification is mainly described. In the fifth modification, the configuration of a leaf spring 2e and the configuration of a wiring board 11a are different. In the fifth modification, the same reference numerals are given to the same configurations as those in the embodiment.

In the fifth modification, a surface mount type leaf spring 2e is adopted. In the leaf spring 2e, a fixing portion 21e is provided along one surface of the wiring board 11a. Preferably, the fixing portion 21e is provided parallel to one surface of the wiring board 11a.

The wiring board 11a is provided with a wiring 15a instead of the through-hole wiring 15. The wiring 15a is provided on one surface of the wiring board 11a. The fixing portion 21e is electrically and mechanically connected to the wiring 15a by the second solder 16.

The fifth modification can exert the same effects as that of the embodiment. Further, in the fifth modification, the leaf spring 2e can be mounted by the same process as the surface mount type electronic component 12. It should be noted that the fifth modification is implementable in combination with each of the first to fourth modifications. That is, the leaf spring 2e may include the connecting portion 27a and the like.

(Sixth Modification)

Figure 12:
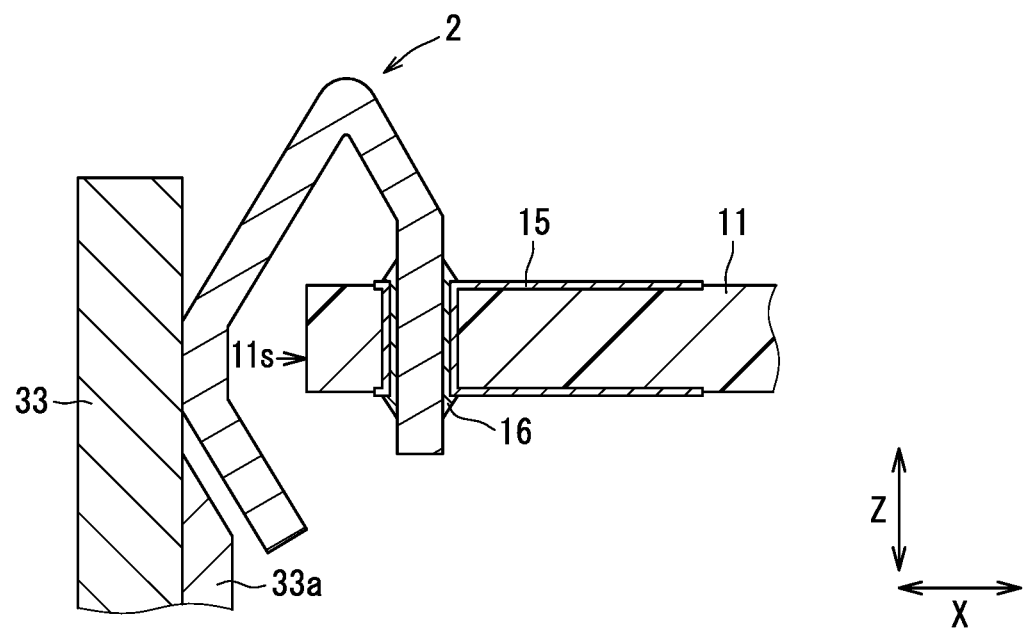
FIG. 12 is a cross-sectional view of a schematic configuration of a sixth modification.

The electronic device 100 is implementable as a sixth modification described in the following with reference to FIG. 12. Here, a portion different from the embodiment in the sixth modification is mainly described. In the sixth modification, the configuration of the side wall 33 is different. In the sixth modification, the same reference numerals are given to the same configurations as those in the embodiment.

The side wall 33 has a stopper 33a. The stopper 33a is a portion protruding from the surrounding surface. The stopper 33a is provided on the side wall 33 directly below the portion in contact with the pressing portion 22. The stopper 33a has a portion inclined so as to gradually increase in thickness from the opening end side of the base 31 toward the bottom wall 32. Preferably, the stopper 33a is provided parallel to the guide portion 26.

The sixth modification can exert the same effects as that of the embodiment. Further, in the sixth modification, it is possible to suppress the circuit board 1 from moving in the Z direction. That is, in the sixth modification, it is possible to prevent the circuit board 1 from falling toward the bottom wall 32 than the stopper 33a. It should be noted that the sixth modification is implementable in combination with each of the first to fifth modifications.

(Seventh Modification)

Figure 13:
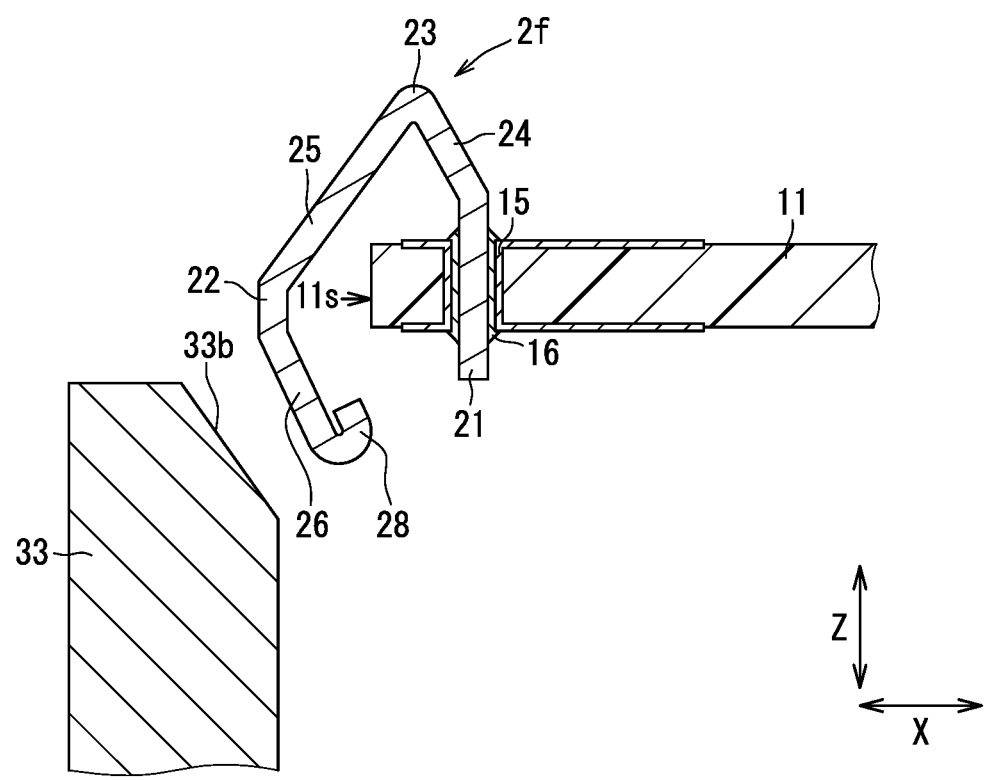
FIG. 13 is a cross-sectional view of a schematic configuration of a seventh modification.

The electronic device 100 is implementable as a seventh modification described in the following with reference to FIG. 13. Here, a portion different from the embodiment in the seventh modification is mainly described. In the seventh modification, the configuration of a leaf spring 2f and the configuration of the side wall 33 are different. In the seventh modification, the same reference numerals are given to the same configurations as those in the embodiment.

The side wall 33 has an inclined portion 33b above the portion pressed by the pressing portion 22. It can be understood that the inclined portion 33b is a portion where an upper end of the side wall 33 is partly cut out. Further, it can be understood that the side wall 33 is provided with the inclined portion 33b at a corner of the opening end on the accommodation space side. Therefore, the base 31 has a portion in which the opening area gradually increases from the bottom wall 32 toward the opening end because the inclined portion 33b is provided.

Further, it can be understood that the side wall 33 is provided with the inclined portion 33b above a vertical portion. That is, it can be understood that the base 31 has a vertical portion provided perpendicular to the bottom wall 32 and the inclined portion 33b continuously provided on (i.e., on top of) the vertical portion.

The leaf spring 2f is provided with a tip portion 28 at an end portion of the guide portion 26. The tip portion 28 has a curved shape. The tip portion 28 is located at the tip of the leaf spring 2f and is a rounded portion.

In the manufacturing method of the seventh modification, when the circuit board 1 is put in the accommodation space, the circuit board 1 is moved until the pressing portion 22 is located closer to the bottom wall 32 than the inclined portion 33b. That is, the manufacturing method moves the pressing portion 22 to a position where the vertical portion of the side wall 33 is pressed. As a result, in the electronic device 100, the circuit board 1 is stably held by the base 31 by a repulsive force of the leaf spring 2f, and the wiring 15 and the base 31 are electrically connected.

The seventh modification can exert the same effects as that of the embodiment. Further, in the seventh modification, since the inclined portion 33b is provided, an angle difference between the tip portion 28 of the leaf spring 2f and the inclined portion 33b becomes small. Therefore, in the seventh modification, an insertion force when putting the circuit board 1 in the accommodation space on which the leaf spring 2f is mounted can be suppressed. The insertion force can also be understood as a resistance force.

Further, in the seventh modification, since the tip portion 28 is provided on the leaf spring 2f, the resistance force when putting the circuit board 1 on which the leaf spring 2f is mounted in the accommodation space can be further suppressible. Therefore, in the seventh modification, stress on the wiring board 11 during assembly and unintentional temporary stop of the automatic assembly device are both suppressible. The temporary stop in the above indicates that the leaf spring 2f caught on the side wall 33 during the assembly work causes a temporary stop of the automatic assembly line.

Further, in the seventh modification, it is possible to prevent the side wall 33 from being scraped/scratched by the leaf spring 2f. Therefore, in the seventh modification, since the scraped dust of the side wall 33 is prevented from entering the housing 3, it is possible to prevent the circuit board 1 from being electrically adversely affected.

It should be noted that the seventh modification is implementable in combination with each of the first to sixth modifications. Further, in the seventh modification, a leaf spring 2f having a tip portion 28 is adopted. However, in the seventh modification a tip portion 28 may be dispensed. That is, in the seventh modification, the leaf spring 2 or the like may be used.

(Eighth Modification)

Figure 14:
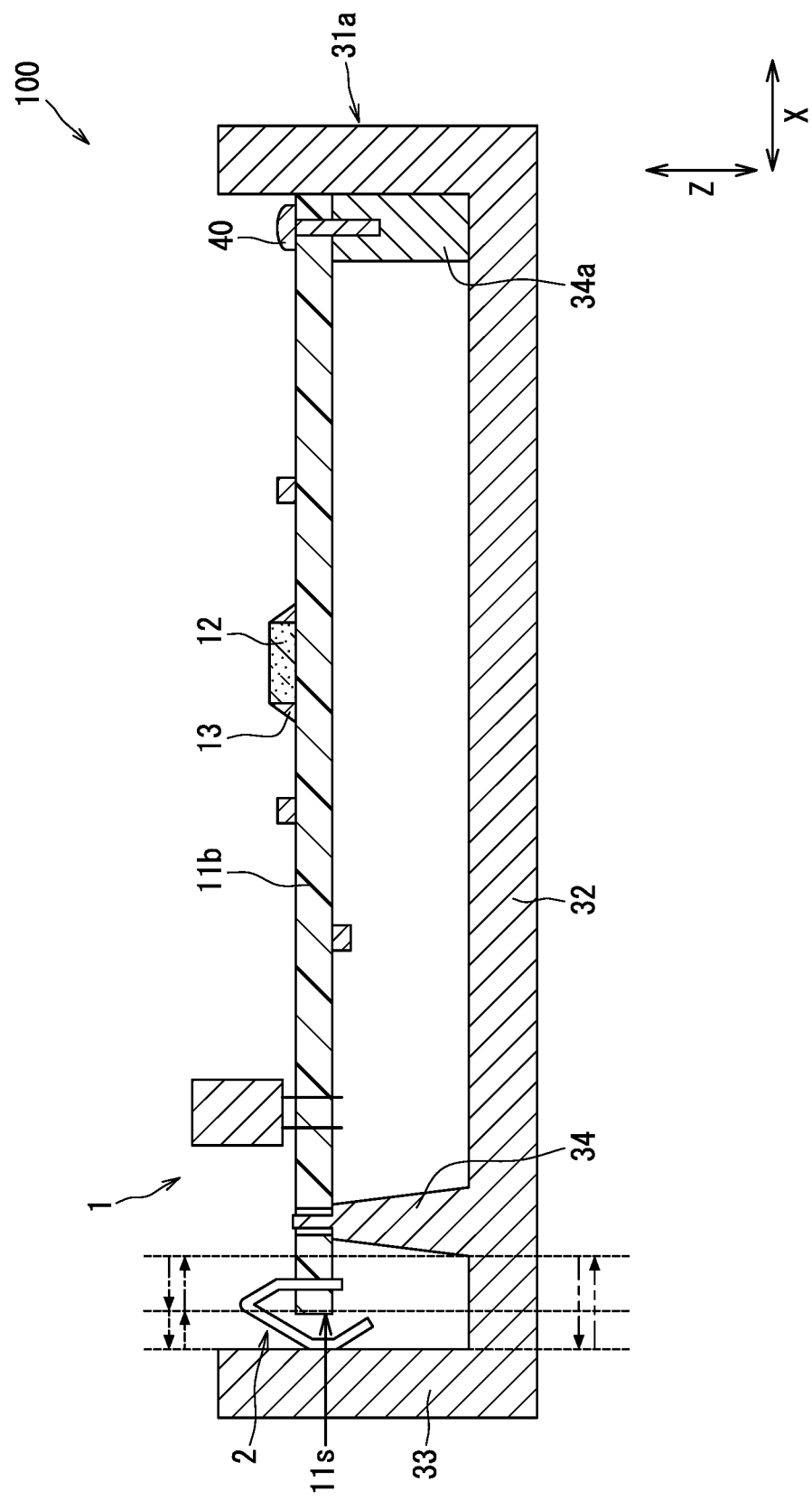
FIG. 14 is a cross-sectional view of a schematic configuration of an eighth modification.

The electronic device 100 is implementable as an eighth modification described in the following with reference to FIG. 14. Here, a portion different from the embodiment in the eighth modification is mainly described. The eighth modification has a different fixed structure of the circuit board 1. In the eighth modification, the same reference numerals as those in the embodiment are given to the same configurations as those in the embodiment. The broken line, the alternate long and short dash line, and the alternate long and short dash line in FIG. 14 are the same as those of the embodiment.

A base 31a is provided with a screw pedestal 34a provided having screw holes. The screw pedestal 34a is a portion that supports the circuit board 1 like the support portion 34. Further, the screw pedestal 34a is provided with a screw hole on a surface in contact with a wiring board 11b.

The wiring board 11b is provided with a through hole at a position facing the screw hole. The wiring board 11b is fixed to the base 31a by screws 40 in a state of being arranged on the support portion 34 and the screw pedestal 34a.

As described above, in the electronic device 100, at least one position of the wiring board 11b is fixed to the base 31a by the screw 40. In the electronic device 100, for example, one or two of the four corners of the wiring board 11b are fixed by the screws 40.

The eighth modification can exhibit the same effects as that of the embodiment. Further, in the eighth modification, the circuit board 1 can be fixed more firmly than in the embodiment. Therefore, the eighth modification can improve the anti-vibration characteristics in addition to improving the life of the first solder 13.

(Ninth Modification)

Figure 15:
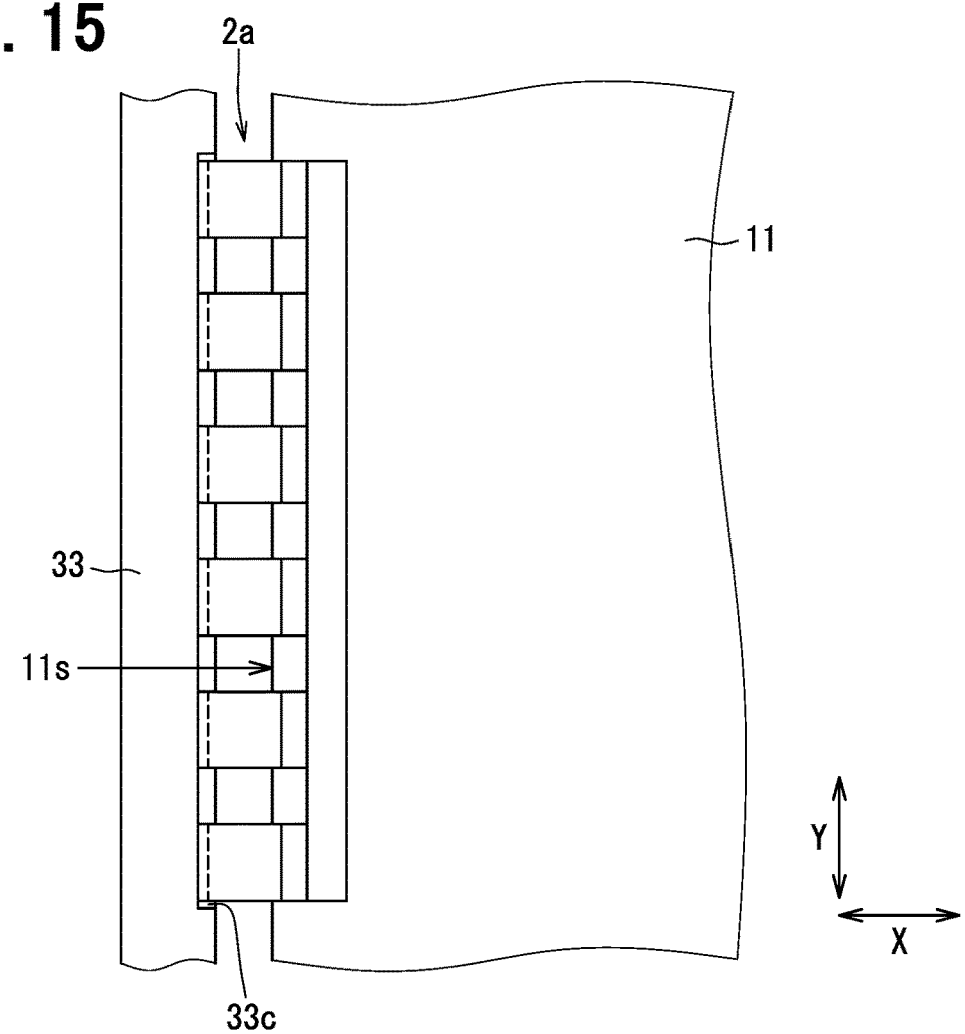
FIG. 15 is a plan view of a schematic configuration of a ninth modification.

The electronic device 100 is implementable as a ninth modification described in the following with reference to FIG. 15. Here, a portion different from the first modification in the ninth modification is mainly described. In the ninth modification, the configuration of the side wall 33 is different. In the ninth modification, the same reference numerals as those in the first modification are given to the same configuration as the first modification.

The side wall 33 is provided with a positioner 33c, which is a recess (i.e., a groove portion) for positioning recessed from the surrounding surface. The positioner 33c is provided on the surface of the side wall 33 that is pressed by the pressing portion 22. The positioner 33c is provided along a direction in which the spring portions are connected. Further, the positioner 33c can also be designated as a step or a groove for positioning provided on the side wall 33.

The circuit board 1 is accommodated in the base 31 in a state where a plurality of pressing portions 22 configured as an integral, one-body component are arranged in the positioner 33c. Therefore, the pressing portion 22 presses the side wall 33 in a state of being positioned by the positioner 33c.

The ninth modification can exert the same effects as the first modification. Further, in the ninth modification, a misalignment of the wiring board 11 on which the leaf spring 2a is mounted can be suppressed. For example, in an example of FIG. 15, it is possible to prevent the wiring board 11 from being dislocated in the Y direction. The ninth modification can also be implemented in combination with the embodiment and the second to eighth modifications.

(Tenth Modification)

Figure 16:
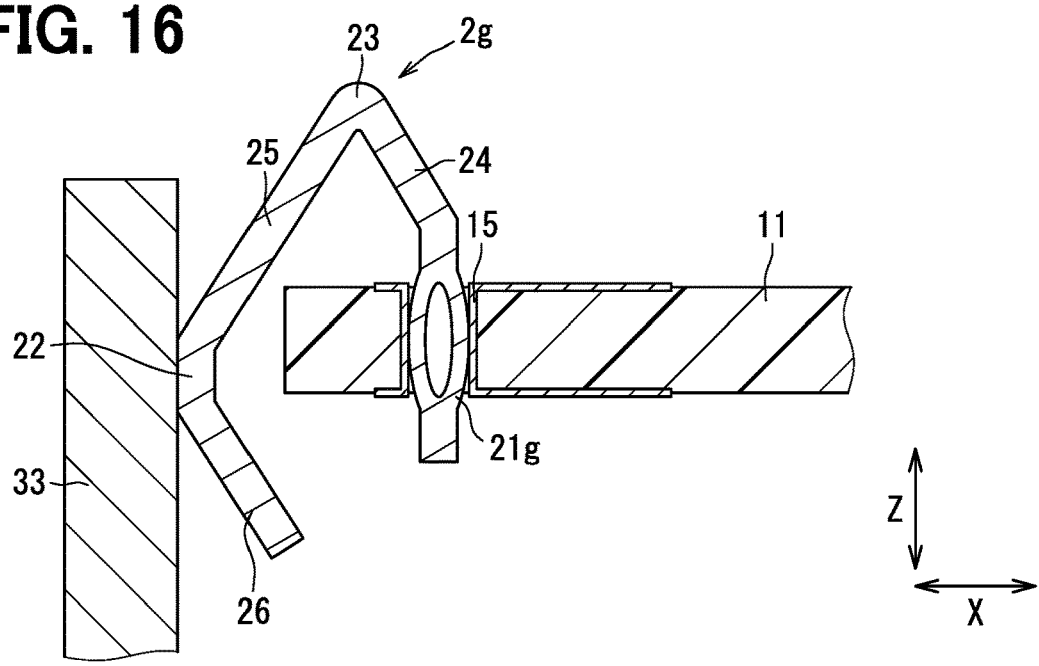
FIG. 16 is a cross-sectional view of a schematic configuration of a tenth modification.

The electronic device 100 is implementable as a tenth modification described in the following with reference to FIG. 16. Here, a portion different from the embodiment in the tenth modification is mainly described. The tenth modification has a different fixed structure of a leaf spring 2g. In the tenth modification, the same reference numerals are given to the same configurations as those in the embodiment. Similar to the embodiment, the wiring board 11 is provided with the wiring 15 on the interior surface of the through hole provided in (i.e., bored along) the thickness direction of the wiring board 11.

The leaf spring 2g has a fixing portion 21g that is press-fitted into the through hole. The fixing portion 21g is deformed by being inserted into the through hole, and the reaction force presses the wiring 15. That is, the leaf spring 2g has the fixing portion 21g as a press-fit terminal. The leaf spring 2g is electrically and mechanically connected to the wiring 15 in a state of being press-fitted into the through hole.

In the manufacturing method of the tenth modification, the circuit board 1 on which the leaf spring 2g is not mounted is arranged in the base 31. Then, the leaf spring 2g is mounted on the circuit board 1 by press-fitting the fixing portion 21g into the through hole of the wiring board 11.

The tenth modification can exert the same effects as that of the embodiment. Further, in the tenth modification, by press-fitting the leaf spring 2g into the through hole of the wiring board 11, the mechanical connection and the electrical connection between the wiring board 11 and the base 31 can be collectively performed (i.e., are performable in one action).

What is claimed is:

1. An electronic device comprising: a circuit board having (i) a wiring board on which wiring is formed and (ii) an electronic component electrically connected to the wiring via a conductive connecting member and mounted on the wiring board; a housing for accommodating the circuit board and having a side wall facing a side surface of the wiring board; and a leaf spring arranged on the circuit board and capable of contacting the housing, wherein the leaf spring including at least one fixing portion arranged on the circuit board and at least one pressing portion extending from the fixing portion and pressing the side wall puts the pressing portion in contact with the housing, and, establishes a contact of the pressing portion with the housing, wherein the leaf spring has a connecting portion that connects the fixing portion and the pressing portion that form a pair.

2. The electronic device of claim 1, wherein
the side wall has an adjusting protrusion protruding toward the side surface for every other pressing portions,
two adjacent pairs of the fixing portion and the pressing portion have the same length along the pressing direction for pressing the side wall, and
the connecting portion is inclined with respect to the pressing direction to connect adjacent leaf springs.

3. The electronic device of claim 1, wherein
the connecting portion has a curved shape.

4. The electronic device of claim 1, wherein
the wiring is provided on a surface of a through hole bored along the thickness direction of the wiring board, and
the fixing portion is electrically and mechanically connected to the wiring in a state of being inserted into the through hole.

5. The electronic device of claim 1, wherein
the wiring is provided on a surface of a through hole bored along the thickness direction of the wiring board, and
the fixing portion is electrically and mechanically connected to the wiring in a state of being press-fitted into the through hole.

6. The electronic device of claim 1, wherein
the wiring is provided on one surface of the wiring board, and
the fixing portion is electrically and mechanically connected to the wiring.

7. The electronic device of claim 1, wherein
the side wall is provided with a positioner for positioning that is recessed from a surrounding surface, and
the pressing portion presses the side wall in a state of being positioned by the positioner.

8. The electronic device of claim 1, wherein
the side wall has an inclined portion above the portion pressed by the pressing portion.

9. The electronic device of claim 1, further comprising a screw for fixing the circuit board and the housing.

10. The electronic device of claim 1, wherein
the side wall is provided with a portion protruding from the surrounding surface below a portion pressed by the pressing portion as a stopper for preventing the leaf spring from falling.

11. The electronic device of claim 1, wherein
the housing is composed mainly of metal, and
the leaf spring is composed of a conductive material as a main component, is electrically connected to the wiring, and presses the side wall by the pressing portion to electrically connect the wiring and the housing.

* * * * *